US009971921B2

(12) United States Patent
Zhu et al.

(10) Patent No.: US 9,971,921 B2
(45) Date of Patent: May 15, 2018

(54) FINGERPRINT IMAGE SENSOR AND METHOD FOR OPTICAL WIRELESS COMMUNICATIONS USING THE SAME

(71) Applicant: Shanghai Oxi Technology Co., Ltd, Shanghai (CN)

(72) Inventors: Hong Zhu, Shanghai (CN); Weiping Lin, Shanghai (CN)

(73) Assignee: Shanghai Oxi Technology Co., Ltd, Shanghai (CN)

( * ) Notice: Subject to any disclaimer, the term of this patent is extended or adjusted under 35 U.S.C. 154(b) by 155 days.

(21) Appl. No.: 15/109,789

(22) PCT Filed: Aug. 7, 2015

(86) PCT No.: PCT/CN2015/086345
§ 371 (c)(1),
(2) Date: Jul. 5, 2016

(87) PCT Pub. No.: WO2017/024439
PCT Pub. Date: Feb. 16, 2017

(65) Prior Publication Data
US 2017/0228579 A1 Aug. 10, 2017

(51) Int. Cl.
*G06K 9/00* (2006.01)
*H04B 10/116* (2013.01)
*H01L 25/16* (2006.01)

(52) U.S. Cl.
CPC ....... *G06K 9/00013* (2013.01); *G06K 9/0004* (2013.01); *G06K 9/00046* (2013.01);
(Continued)

(58) Field of Classification Search
None
See application file for complete search history.

(56) References Cited

U.S. PATENT DOCUMENTS 9,829,614 B2 * 11/2017 Smith .................... G02B 27/58
9,864,893 B2 * 1/2018 Kim ...................... G06K 9/0004
(Continued)

FOREIGN PATENT DOCUMENTS

CN 101587254 A 11/2009
CN 104463107 A 3/2015
(Continued)

OTHER PUBLICATIONS

International Search Report from PCT/CN2015/086345, dated Apr. 29, 2016.
Written Opinion from PCT/CN2015/086345, dated Apr. 29, 2016.

*Primary Examiner* — Utpal Shah
(74) *Attorney, Agent, or Firm* — Swanson & Bratschun, L.L.C.

(57) ABSTRACT

The present disclosure provides a fingerprint image sensor and a method for optical wireless communications using the same. The fingerprint image sensor includes: a backlight plate; an image sensor unit, disposed above the backlight plate; and a protection layer, disposed above the image sensor substrate; wherein the fingerprint image sensor is configured to operate at least in a transmitting mode and a receiving mode, where in the transmitting mode, the backlight plate is turned on and configured to emit lights with different optical characteristics representing coded information, and in the receiving mode, the backlight plate is turned off and the image sensor unit senses external lights and convert the external lights to electric signals. The present disclosure further provides methods for transmitting and receiving information using the fingerprint image sensor. Accordingly, the fingerprint image sensor can work as a transceiver to realize optical wireless communications.

23 Claims, 3 Drawing Sheets (52) U.S. Cl.
CPC .......... *H01L 25/167* (2013.01); *H04B 10/116* (2013.01); *G06K 2009/0006* (2013.01)

(56) References Cited

U.S. PATENT DOCUMENTS

| | | | |
|---|---|---|---|
| 2004/0252867 A1* | 12/2004 | Lan | G06K 9/0004 |
| | | | 382/124 |
| 2005/0213799 A1* | 9/2005 | Sawano | G06K 9/0002 |
| | | | 382/124 |
| 2010/0165255 A1* | 7/2010 | Ishitani | G02F 1/133603 |
| | | | 349/69 |
| 2010/0183200 A1* | 7/2010 | Wu | G06K 9/00046 |
| | | | 382/127 |
| 2012/0321149 A1* | 12/2012 | Carver | G06K 9/0004 |
| | | | 382/124 |
| 2013/0300313 A1* | 11/2013 | Yamazaki | G02B 27/22 |
| | | | 315/291 |
| 2016/0224819 A1* | 8/2016 | Kim | G06K 9/0004 |
| 2017/0352197 A1* | 12/2017 | Mitsunaga | G07B 15/00 |

FOREIGN PATENT DOCUMENTS

| | | |
|---|---|---|
| CN | 104598899 A | 5/2015 |
| EP | 2821949 A2 | 1/2015 |

* cited by examiner

FINGERPRINT IMAGE SENSOR AND METHOD FOR OPTICAL WIRELESS COMMUNICATIONS USING THE SAME

RELATED APPLICATIONS

This application is a 35 U.S.C. § 371 national phase application of PCT/CN2015/086345, filed on Aug. 7, 2015, entitled "Fingerprint Image Sensor and Method for Optical Wireless Communications Using the Same", the entire disclosure of which is incorporated herein by reference.

TECHNICAL FIELD

The present disclosure generally relates to optical communications, and more particularly, to a fingerprint image sensor and a method for optical wireless communications using the same.

BACKGROUND

Optical wireless communications transmit and receive information via lights without using any wired medium such as optical fibers. Since technologies for optical wireless communications are still at a research stage, especially light sources for optical wireless communications, they have not been realized in commercial applications yet. Optical wireless communications possess advantages of suffering less electromagnetic interferences and less conflicts of frequency spectrum.

SUMMARY

A fingerprint image sensor is provided according to one embodiment. The fingerprint image sensor may include: a backlight plate; an image sensor unit, disposed above the backlight plate; and a protection layer, disposed above the image sensor unit; wherein the fingerprint image sensor may be configured to operate at least on a transmitting mode and a receiving mode, where in the transmitting mode, the backlight plate may be turned on and configured to emit lights with different optical characteristics representing coded information, and in the receiving mode, the backlight plate may be turned off and the image sensor unit may be adapted to sense external lights and convert the external lights to electrical signals carrying the coded information.

In some embodiments, the optical characteristics may include color, intensity, frequency and phase.

In some embodiments, the backlight plate may be configured to emit the lights possessing different optical characteristics at each time point.

In some embodiments, the lights emitted by the backlight plate with different optical characteristics may last for a period of time.

In some embodiments, the backlight plate may include at least one light source and a light guide plate, where the light guide plate may be disposed beside the light source and adapted to transmit the lights. The light source may be a visible light source, an infrared source or an ultraviolet source.

The fingerprint image sensor may further include: a backlight driving circuit coupled with the backlight plate, where the backlight driving circuit may be adapted to control the backlight plate to emit lights with different optical characteristics representing coded information; and an encoding circuit coupled with the backlight driving circuit, where the encoding circuit may be adapted to encode original information to form coded information.

The fingerprint image sensor may further include: a decoding circuit coupled with the fingerprint sensor unit, where the decoding circuit may be adapted to decode the electric signals carrying the coded information received from the image sensor unit to recover original information.

In some embodiments, the fingerprint image sensor may further include: an optical transforming substrate, disposed between the backlight plate and the image sensor unit, where the optical transforming substrate may include multiple pixels and may be adapted to transform the lights emitted from the backlight plate to planar array lights, where the planar array lights may carry multiple optical information respectively corresponding to the multiple pixels, and each of the multiple optical information may be expressed by different brightness, color or refresh frequency.

The present disclosure also provides a method for transmitting information using the fingerprint image sensor stated hereinbefore. The method may include: turning on the backlight plate to emit lights, wherein the lights may possess different optical characteristics representing coded information.

In some embodiments, the lights may include planar array lights.

In some embodiments, the optical characteristics may include color, intensity, frequency and phase.

In some embodiments, the backlight plate may be configured to emit the lights possessing different optical characteristics at each time point.

In some embodiments, the lights emitted by the backlight plate with different optical characteristics may last for a period of time.

The method may further include: providing original information; encoding the original information to form the coded information; and converting the coded information to backlight driving information, which may control the backlight plate emitting lights possessing different optical characteristics representing the coded information.

The present disclosure further provides a method for receiving information using the fingerprint image sensor stated hereinbefore. The method may include: turning off the backlight plate; sensing external lights; converting the external lights to electric signals carrying the coded information; and decoding the electric signals to recover original information.

In some embodiments, the external lights may include planar array lights.

In some embodiments, the optical characteristics may include color, intensity, frequency and phase.

In some embodiments, the backlight plate may be configured to emit the lights possessing different optical characteristics at each time point.

In some embodiments, the lights emitted by the backlight plate with different optical characteristics may last for a period of time.

Accordingly, embodiments of the present disclosure possess following advantages: optical wireless communications, especially planar array optical wireless communications, can be realized using the fingerprint image sensor without many hardware modifications, which may lower costs and improve integration level.

DETAILED DESCRIPTION

By research, the inventor discovers that a fingerprint image sensor includes a backlight plate and an image sensor unit. The backlight plate may be configured to emit lights with different features, which may be used to contain information. The image sensor unit may be inherently used for sensing lights reflected by a finger to obtain a fingerprint, which may also be used for sensing different external lights. Thus, the fingerprint image sensor may work as a transceiver for optical wireless communications.

The present disclosure provides a fingerprint image sensor. The finger image sensor may include: a backlight plate; an image sensor unit, disposed above the backlight plate; and a protection layer, disposed above the image sensor unit; wherein the fingerprint image sensor may be configured to operate at least in a transmitting mode and a receiving mode, where in the transmitting mode, the backlight plate may be turned on and configured to emit lights with different optical characteristics representing coded information, and in the receiving mode, the backlight plate may be turned off and the image sensor unit may be adapted to sense external lights and convert the external lights to electric signals carrying the ended information. Therefore, optical wireless communications, especially planar array optical wireless communications, may be realized using the fingerprint image sensor without many hardware modifications, which may lower costs and improve integration level.

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Figure 1:
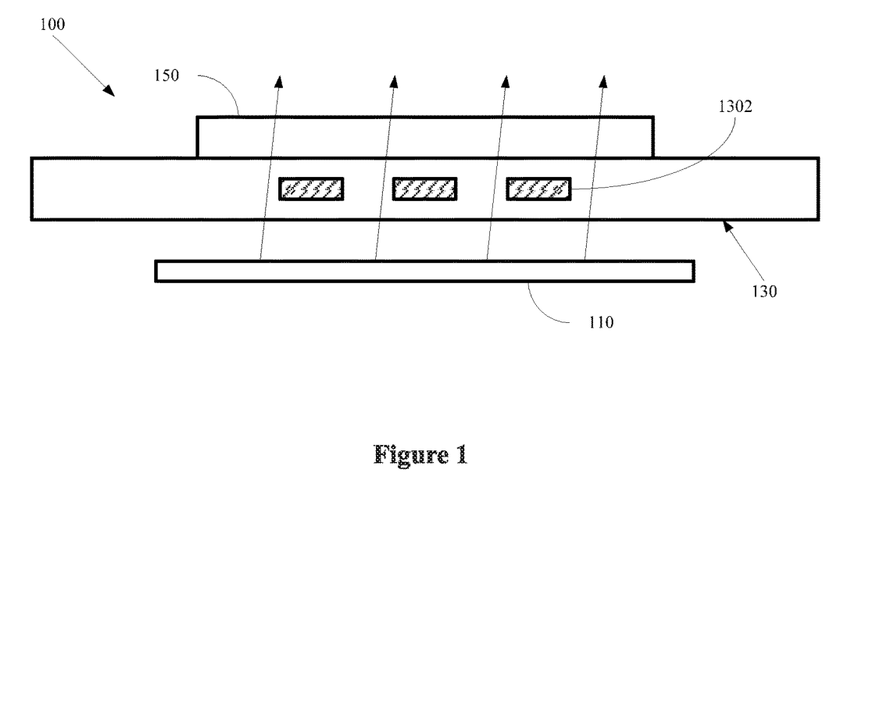
FIG. 1 schematically illustrates a structural diagram presenting a fingerprint image sensor according to one embodiment of the present disclosure.

FIG. 1 schematically illustrates a structural diagram presenting a fingerprint image sensor according to one embodiment of the present disclosure.

Referring to FIG. 1, the fingerprint image sensor 100 may include: a backlight plate 110; a substrate 130 including an image sensor unit 1302, disposed above the backlight plate 110; and a protection layer 150, disposed above the substrate 130; wherein the fingerprint image sensor 100 may be configured to operate at least in a transmitting mode and a receiving mode, where in the transmitting mode, the backlight plate 110 may be turned on and configured to emit lights with different optical characteristics representing coded information, and in the receiving mode, the backlight plate 110 may be turned off and the image sensor unit 1302 may be adapted to sense external lights and convert the external lights to electric signals carrying the encoded information.

Specifically, the optical characteristics may include color, intensity, frequency and phase.

In this embodiment, the backlight plate may be configured to emit the lights possessing different optical characteristics at each time point.

In some embodiments, the lights emitted by the backlight plate with different optical characteristics may last for a period of time.

Specifically, the coded information may correspond to the optical characteristics. For example, the backlight plate may be turned on, which corresponds to true in the coded information, where true is represented as 1 in a binary system, and the backlight plate may be turned off, which corresponds to false in the coded information, where false is represented as 0 in the binary system.

In this embodiment, the backlight plate 110 may include at least one light source and a light guide plate, where the light guide plate may be disposed beside the light source and adapted to transmit the lights. The light source may be a visible light source, an infrared source or an ultraviolet source. Specifically, the visible light source may be a Light Emitting Diode (LED) or a light bulb. Moreover, if the backlight plate 110 includes multiple light sources, the multiple light sources may be same in color or different.

In this embodiment, the fingerprint image sensor 100 may further include: a backlight driving circuit (not shown) coupled with the backlight plate, where the backlight driving circuit may be adapted to control the backlight plate to emit lights with different optical characteristics representing coded information.

In this embodiment, the fingerprint image sensor 100 may further include: an encoding circuit (not shown) coupled with the backlight driving circuit, where the encoding circuit may be adapted to encode original information to form coded information.

In this embodiment, the fingerprint image sensor 100 may further include: a decoding circuit (not shown) coupled with the fingerprint sensor unit, where the decoding circuit may be adapted to decode the electric signal carrying the coded information received from the image sensor unit to recover original information.

In this embodiment, the fingerprint sensor unit may be embedded in a TFT substrate, which is transparent. Moreover, the protection layer 150 may be either translucent or transparent. Thus, the lights emitted from the backlight plate 110 may propagate through the TFT substrate and the protection layer 150 without many reflections, refractions and scatters, and the lights may keep most of energy after propagating through the TFT substrate and the protection layer 150. The lights emitted from the backlight plate 110 may be blocked by the image sensor unit 1302.

Figure 2:
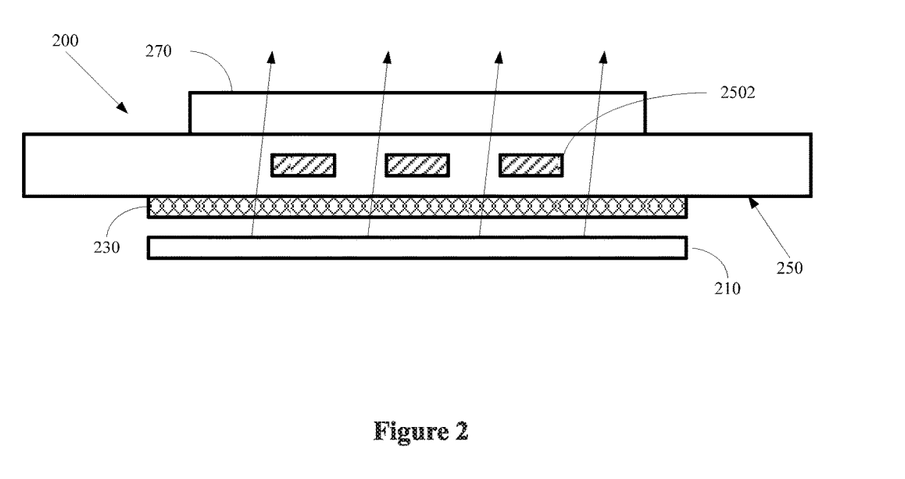
FIG. 2 schematically illustrates a structural diagram presenting a fingerprint image sensor according to another embodiment of the present disclosure.

FIG. 2 schematically illustrates a structural diagram presenting a fingerprint image sensor according to another embodiment of the present disclosure.

Referring to FIG. 2, the fingerprint image sensor 200 may include: a backlight plate 210; a substrate 250 including an image sensor unit 2502, disposed above the backlight plate 210; and a protection layer 270, disposed above the substrate 250; wherein the fingerprint image sensor 200 may be configured to operate at least on a transmitting mode and a receiving mode, where in the transmitting mode, the backlight plate 210 may be turned on and configured to emit lights with different optical characteristics representing coded information, and in the receiving mode, the backlight plate 210 may be turned off and the image sensor unit 2502 may be adapted to sense external lights and convert the external lights to the electric signal carrying the coded information.

Specifically, the optical characteristics comprise color, intensity, frequency and phase.

In this embodiment, the backlight plate may be configured to emit the lights possessing different optical characteristics at each time point.

In some embodiments, the lights emitted by the backlight plate with different optical characteristics may last for a period of time.

In this embodiment, the backlight plate 210 may include at least one light source and a light guide plate, where the light guide plate may be disposed beside the light source and adapted to transmit the lights. The light source may be a visible light source, an infrared source or an ultraviolet source. Specifically, the visible light source may be a Light Emitting Diode (LED) or a light bulb. Moreover, if the backlight plate 210 includes multiple light sources, the multiple light sources may be same in color or different.

In this embodiment, the fingerprint image sensor 200 may further include: a backlight driving circuit (not shown) coupled with the backlight plate, where the backlight driving circuit may be adapted to control the backlight plate to emit lights with different optical characteristics representing coded information; an encoding circuit (not shown) coupled with the backlight driving circuit, where the encoding circuit may be adapted to encode original information to form coded information.

In this embodiment, the fingerprint image sensor 200 may further include: a decoding circuit (not shown) coupled with the fingerprint sensor unit, where the decoding circuit may be adapted to decode the electric signal carrying the coded information received from the image sensor unit to recover original information.

In this embodiment, the fingerprint image sensor 200 may further include: an optical transforming substrate 230, disposed above the backlight plate 210 and below the substrate 250, where the optical transforming substrate 230, which may be either transparent or translucent, may include multiple pixels, and the optical transforming substrate 230 may be adapted to transform the lights emitted by the backlight plate to planar array lights, where the planar array lights may carry multiple optical information respectively corresponding to the multiple pixels, and each of the multiple optical information may be expressed by different brightness, color or refresh frequency. Specifically, the optical transforming substrate 230 may be formed using color filter, liquid crystal or polaroid.

In this embodiment, the fingerprint sensor unit may be embedded in a TFT substrate, which is transparent. Moreover, the protection layer 270 may be either transparent or translucent. Thus, the lights emitted by the backlight plate 210 may propagate through the optical transforming substrate 230, the TFT substrate and the protection layer 270 without many reflections, refractions and scatters, and the lights may keep most of energy after propagating through the optical transforming substrate 230, the TFT substrate and the protection layer 270. The lights emitted from the backlight plate 210 may be blocked by the image sensor unit 2502.

Figure 3:
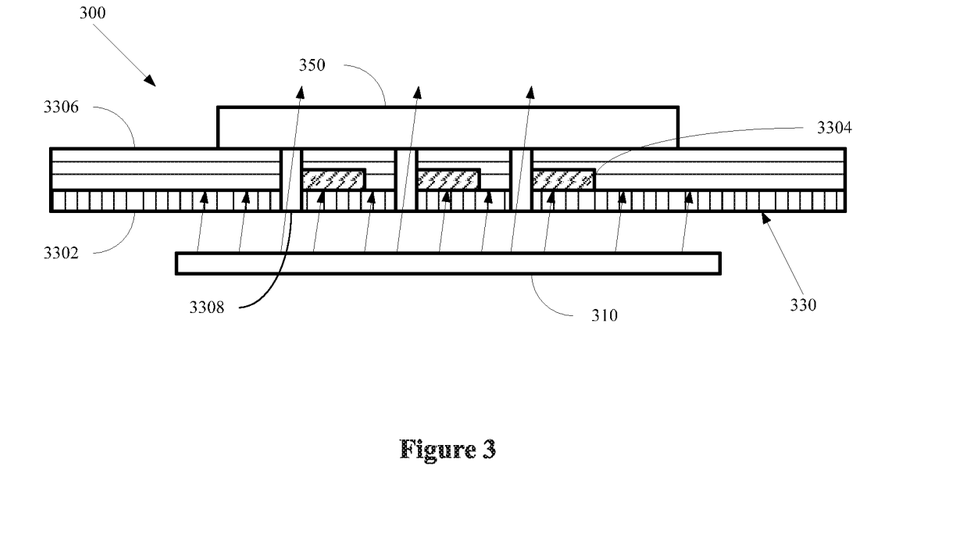
FIG. 3 schematically illustrates a structural diagram presenting a fingerprint image sensor according to another embodiment of the present disclosure.

FIG. 3 schematically illustrates a structural diagram presenting a fingerprint image sensor according to another embodiment of the present disclosure.

Referring to FIG. 3, the fingerprint image sensor 300 may include: a backlight plate 310; an image sensor substrate 330 including an image sensor unit 3304, disposed above the backlight plate 310; and a protection layer 350, disposed above the image sensor substrate 330; wherein the fingerprint image sensor 300 may be configured to operate at least in a transmitting mode and a receiving mode, where in the transmitting mode, the backlight plate 310 may be turned on and configured to emit lights with different optical characteristics representing coded information, and in the receiving mode, the backlight plate 310 may be turned off and the image sensor unit 3304 may sense external lights and convert the external lights to electric signals carrying the coded information.

Specifically, the optical characteristics comprise color, intensity, frequency and phase.

In this embodiment, the backlight plate may be configured to emit the lights possessing different optical characteristics at each time point.

In some embodiments, the lights emitted by the backlight plate with different optical characteristics may last for a period of time.

In this embodiment, the backlight plate 310 may include at least one light source and a light guide plate, which may be disposed beside the light source and adapted to transmit the lights. The light source may be a visible light source, an infrared source or an ultraviolet source. Specifically, the visible light source may be a Light Emitting Diode (LED) or a light bulb. Moreover, if the backlight plate 310 includes multiple light sources, the multiple light sources may be same in color or different.

In this embodiment, the fingerprint image sensor 300 may further include: a backlight driving circuit (not shown) coupled with the backlight plate, where the backlight driving circuit may be adapted to control the backlight plate to emit lights with different optical characteristics representing coded information; an encoding circuit (not shown) coupled with the backlight driving circuit, where the encoding circuit may be adapted to encode original information to form coded information.

In this embodiment, the fingerprint image sensor 300 may further include: a decoding circuit (not shown) coupled with the fingerprint sensor unit, where the decoding circuit may be adapted to decode the electric signals carrying the coded information received from the image sensor unit to recover original information.

In this embodiment, the image sensor substrate 330 may further include: a base plate 3302 disposed above the backlight plate 310, wherein the image sensor unit 3304 may be disposed above the base plate 3302; and a substrate 3306 disposed on the base plate 3302, wherein the image sensor unit 3304 may be embedded in the substrate 3306.

Specifically, the base plate 3302 may be opaque, and the substrate 3306 may be a CMOS substrate, which is opaque.

In this embodiment, the image sensor substrate 330 may further include: multiple transparent units 3308 disposed aside at least one side of an image sensor of the image sensor unit 3304 and penetrating both the base plate 3302 and substrate 3306; wherein the lights emitted by the backlight plate 310 may propagate through the transparent units 3308 and the protection layer 350, which may be either transparent or translucent, without many reflections, refractions and scatters, and the lights may keep most of energy after propagating through the transparent units 3308 and the protection layer 350; wherein the lights emitted by the backlight plate 310 may be blocked by the image sensor unit 3304, the base plate 3302, or the substrate 3306.

Figure 4:
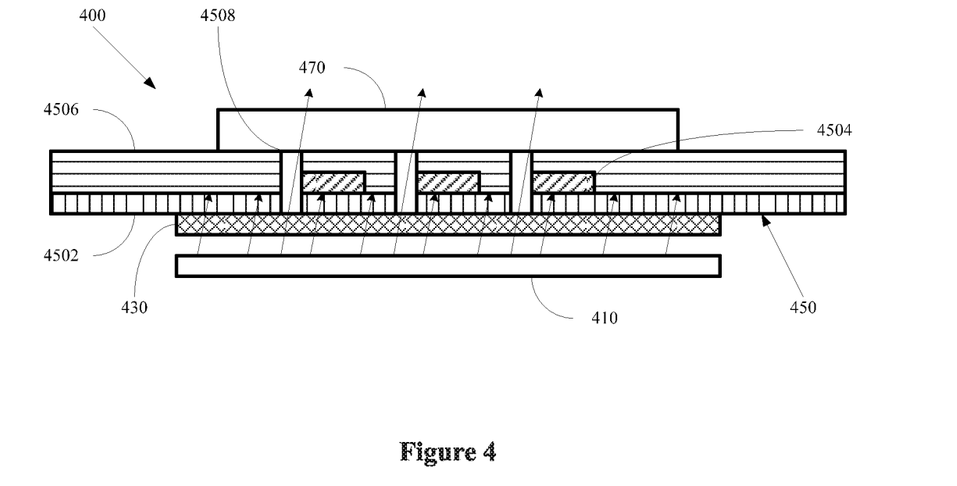
FIG. 4 schematically illustrates a structural diagram presenting a fingerprint image sensor according to another embodiment of the present disclosure.

FIG. 4 schematically illustrates a structural diagram presenting a fingerprint image sensor according to another embodiment of the present disclosure.

Referring to FIG. 4, the fingerprint image sensor 400 may include: a backlight plate 410; an image sensor substrate 450 including an image sensor unit 4504, disposed above the backlight plate 410; and a protection layer 470, disposed above the image sensor substrate 450; wherein the fingerprint image sensor 400 may be configured to operate at least in a transmitting mode and a receiving mode, where in the transmitting mode, the backlight plate 410 may be turned on and configured to emit lights with different optical characteristics representing coded information, and in the receiving mode, the backlight plate 410 may be turned off and the image sensor unit 4504 may be adapted to sense external lights and convert the external lights to electric signals carrying the coded information.

Specifically, the optical characteristics comprise color, intensity, frequency and phase.

In this embodiment, the backlight plate may be configured to emit the lights possessing different optical characteristics at each time point.

In some embodiments, the lights emitted by the backlight plate with different optical characteristics may last for a period of time.

In this embodiment, the backlight plate 410 may include at least one light source and a light guide plate, which may be disposed beside the light source and adapted to transmit the lights. The light source may be a visible light source, an infrared source or an ultraviolet source. Specifically, the visible light source may be a Light Emitting Diode (LED) or a light bulb. Moreover, if the backlight plate 410 includes multiple light sources, the multiple light sources may be same in color or different.

In this embodiment, the fingerprint image sensor 400 may further include: a backlight driving circuit (not shown) coupled with the backlight plate, where the backlight driving circuit may be adapted to control the backlight plate to emit lights with different optical characteristics representing coded information; an encoding circuit (not shown) coupled with the backlight driving circuit, where the encoding circuit may be adapted to encode original information to form coded information.

In this embodiment, the fingerprint image sensor 400 may further include: a decoding circuit (not shown) coupled with the fingerprint sensor unit, where the decoding circuit may be adapted to decode the electric signals carrying the coded information received from the image sensor unit to recover original information.

In this embodiment, the fingerprint image sensor 400 may further include: an optical transforming substrate 430, disposed above the backlight plate 410 and below the substrate 450, where the optical transforming substrate 430, which may be either transparent or translucent, may include multiple pixels, and the optical transforming substrate 430 may be adapted to transform the lights emitted by the backlight plate to planar array lights where the planar array lights may carry multiple optical information respectively corresponding to the multiple pixels, and each of the multiple optical information may be expressed by different brightness, color or refresh frequency. Specifically, the optical transforming substrate 430 may be formed using color filter, liquid crystal or polaroid.

In this embodiment, the image sensor substrate 450 may further include: a base plate 4502, disposed above the backlight plate 410, wherein the image sensor unit 4504 may be disposed above the base plate 4502; and a substrate 4506, disposed on the base plate 4502, wherein the image sensor unit 4504 may be embedded in the substrate 4506.

Specifically, the base plate 4502 may be opaque, and the substrate 4506 may be a CMOS substrate, which is opaque.

In this embodiment, the image sensor substrate 450 may further include: multiple transparent units 4508, disposed aside at least one side of an image sensor of the image sensor unit 4504 and penetrating both the base plate 4502 and substrate 4506; wherein the lights emitted by the backlight plate 410 may propagate through the optical transforming substrate 430, the transparent units 4508 and the protection layer 470, which may be either transparent or translucent, without many reflections, refractions and scatters, and the lights may keep most of energy after propagating through the optical transforming substrate 430, the transparent units 4508 and the protection layer 470; wherein the light emitted by the backlight plate 410 may be blocked by the image sensor unit 4504, the base plate 4502, or the substrate 4506.

Figure 5:
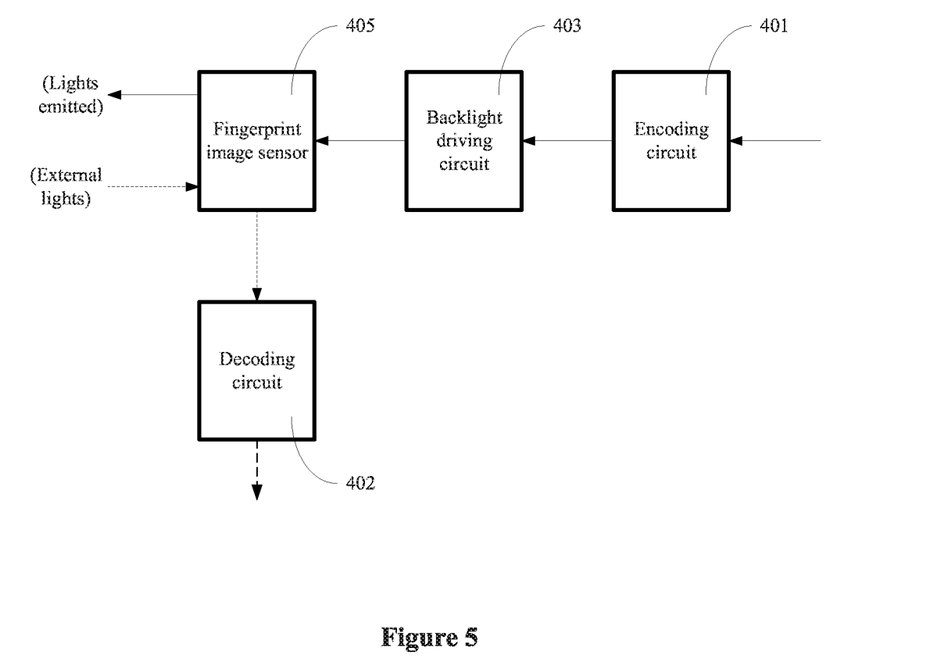
FIG. 5 schematically illustrates a flow diagram presenting methods for transmitting and receiving information use a fingerprint image sensor of the present disclosure.

FIG. 5 schematically illustrates a flow diagram presenting methods for transmitting and receiving information using a fingerprint image sensor of the present disclosure. Referring to FIG. 5, solid lines represent transmission process and dash lines represent receive process.

The present disclosure provides a method for transmitting information using a fingerprint image sensor 505. The method may include: turning on the backlight plate of the fingerprint image sensor 505 to emit lights, wherein the lights may possess different optical characteristics representing coded information.

The fingerprint image sensor 505 may be any one of the fingerprint image sensors stated hereinbefore.

Specifically, the optical characteristics comprise color, intensity, frequency and phase.

In this embodiment, the backlight plate may be configured to emit the lights possessing different optical characteristics at each time point.

In some embodiments, the lights emitted by the backlight plate with different optical characteristics may last for a period of time.

Referring to FIG. 5, the method may further include: providing original information; encoding the original information received to form the coded information via an encoding circuit 501; and converting the coded information received from the encoding circuit 501 to backlight driving information via a backlight driving circuit 503, where the backlight driving information controls the backlight plate emitting lights possessing different optical characteristics representing the coded information and is sent to the fingerprint image sensor 505.

Specifically, the fingerprint image sensor 505 may emit lights based on the backlight driving information. In some embodiments, if the fingerprint image sensor 505 may include the optical transforming substrate, the fingerprint image sensor 505 may emit planar array lights.

The present disclosure provides a method for receiving information using the fingerprint image sensor 505. The method may include: turning off the backlight plate of the fingerprint image sensor 505; sensing external lights using the fingerprint image sensor 505; converting the external lights to electric signals carrying the coded information by the image sensor unit of the fingerprint image sensor 505; and decoding the electric signals to recover original information using a decoding circuit 502.

The fingerprint image sensor 505 may be any one of the fingerprint image sensors stated hereinbefore.

Specifically, the external lights may include planar array lights.

Specifically, the optical characteristics comprise color, intensity, frequency and phase.

In this embodiment, the backlight plate may be configured to emit the lights possessing different optical characteristics at each time point.

In some embodiments, the lights emitted by the backlight plate with different optical characteristics may last for a period of time.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A fingerprint image sensor, comprising:
    a backlight plate;
    an image sensor unit, disposed above the backlight plate; and
    a protection layer, disposed above the image sensor unit;
    wherein the fingerprint image sensor is configured to operate at least in a transmitting mode and a receiving mode, where in the transmitting mode, the backlight plate is turned on and is configured to emits lights with different optical characteristics representing coded information, and in the receiving mode, the backlight plate is turned off and the image sensor unit senses external lights and convert the external lights to electric signals carrying the coded information.

2. The fingerprint image sensor according to claim 1, wherein the optical characteristics comprise color, intensity, frequency and phase.

3. The fingerprint image sensor according to claim 1, wherein the backlight plate is configured to emit the lights possessing different optical characteristics at each time point.

4. The fingerprint image sensor according to claim 1, wherein the lights emitted by the backlight plate with different optical characteristics last for a period of time.

5. The fingerprint image sensor according to claim 1, wherein the backlight plate comprises at least one light source and a light guide plate, which is disposed beside the light source and adapted to transmit the lights.

6. The fingerprint image sensor according to claim 5, wherein the light source is a visible light source, an infrared source or an ultraviolet source.

7. The fingerprint image sensor according to claim 1, further comprising:
    a backlight driving circuit coupled with the backlight plate, where the backlight driving circuit is adapted to control the backlight plate to emit lights with different optical characteristics representing coded information.

8. The fingerprint image sensor according to claim 7, further comprising:
    an encoding circuit coupled with the backlight driving circuit, where the encoding circuit is adapted to encode original information to form coded information.

9. The fingerprint image sensor according to claim 1, further comprising:
    an optical transforming substrate disposed between the backlight plate and the image sensor unit, where the optical transforming substrate comprises a plurality of pixels and is adapted to transform the light emitted to a planar array lights, where the planar array lights carry multiple optical information respectively corresponding to the multiple pixels, and each of the multiple optical information is expressed by different brightness, color or refresh frequency.

10. The fingerprint image sensor according to claim 9, wherein the optical transforming substrate is formed using color filter, liquid crystal or polaroid.

11. The fingerprint image sensor according to claim 1, wherein the image sensor substrate is a CMOS substrate or a TFT substrate.

12. The fingerprint image sensor according to claim 1, further comprising:
    a decoding circuit, coupled with the fingerprint sensors, where the decoding circuit is adapted to decode the electric signals carrying the coded information received from the image sensor unit to recover original information.

13. A method for transmitting information using a fingerprint image sensor, at least comprising a backlight plate; an image sensor unit, disposed above the backlight plate; and a protection layer, disposed above the image sensor unit; wherein the fingerprint image sensor is configured to operate at least in a transmitting mode and a receiving mode, where in the transmitting mode, the backlight plate is turned on and is configured to emits lights with different optical characteristics representing coded information, and in the receiving mode, the backlight plate is turned off and the image sensor unit senses external lights and convert the external lights to electric signals carrying the coded information, comprising:
    turning on the backlight plate to emit lights, wherein the lights possess different optical characteristics representing coded information.

14. The method according to claim 13, wherein the lights comprises planar array lights.

15. The method according to claim 13, wherein the optical characteristics comprise color, intensity, frequency and phase.

16. The method according to claim 13, wherein the backlight plate is configured to emit the lights possessing different optical characteristics at each time point.

17. The method according to claim 13, wherein the lights emitted by the backlight plate with different optical characteristics last for a period of time.

18. The method according to claim 13, wherein further comprising:
    providing original information;
    encoding the original information to form the coded information; and
    converting the coded information to backlight driving information, which controls the backlight plate emitting lights possessing different optical characteristics representing the coded information.

19. A method for receiving information using a fingerprint image sensor, at least comprising a backlight plate; an image sensor unit, disposed above the backlight plate; and a protection layer, disposed above the image sensor unit; wherein the fingerprint image sensor is configured to operate at least in a transmitting mode and a receiving mode, where in the transmitting mode, the backlight plate is turned on and is configured to emits lights with different optical characteristics representing coded information, and in the receiving mode, the backlight plate is turned off and the image sensor unit senses external lights and convert the external lights to electric signals carrying the coded information, comprising:
    turning off the backlight plate;
    sensing external lights;
    converting the external lights to the electric signals carrying the coded information; and
    decoding the electric signals carrying the coded information to recover original information.

20. The method according to claim 19, wherein the external lights comprises planar array lights.

21. The method according to claim 19, wherein the optical characteristics comprise color, intensity, frequency and phase.

22. The method according to claim 19, wherein the backlight plate is configured to emit the lights possessing different optical characteristics at each time point.

23. The method according to claim 19, wherein the lights emitted by the backlight plate with different optical characteristics last for a period of time.

* * * * *